United States Patent [19]
Adachi et al.

[11] 4,389,299
[45] Jun. 21, 1983

[54] SPUTTERING DEVICE

[75] Inventors: Ryuichi Adachi, Toyonaka; Isao Yamada, Uji; Kazuhiro Takeshita, Osaka, all of Japan

[73] Assignee: Osaka Vacuum Chemical Co., Ltd., Osaka, Japan

[21] Appl. No.: 275,784

[22] Filed: Jun. 22, 1981

[30] Foreign Application Priority Data

Jun. 23, 1980 [JP] Japan ................................. 55-85398

[51] Int. Cl.$^3$ ............................................. C23C 15/00
[52] U.S. Cl. .................................. 204/298; 204/192 R
[58] Field of Search ........................... 204/298, 192 R

[56] References Cited

U.S. PATENT DOCUMENTS 3,404,084 10/1968 Hamilton ............................ 204/298
3,669,861 6/1972 Cash et al. .......................... 204/298

FOREIGN PATENT DOCUMENTS 456294 7/1968 Switzerland .

OTHER PUBLICATIONS

Adachi et al., J. Vac. Sci. Tech. 20(1), 1982, pp. 98–99.

Primary Examiner—Arthur P. Demers
Attorney, Agent, or Firm—Darby & Darby

[57] ABSTRACT

The present application discloses a sputtering device comprising a target electrode having a target and a flat magnet located under the target and constituted by an annular magnetic pole having one polarity and a magnetic pole having the other polarity located inside the annular magnetic pole, a substrate disposed oppositely to the target, a ring electrode for electric field for generating an electric field on the magnet at right angle thereto, an electron beam emitting filament disposed adjacent the target, and an anode electrode for guiding an electron from the filament over the target.

According to the present invention, the target material can be effectively deposited to the substrate and efficiently act on the formation of a film.

In addition, since portions of the sputtered neutral target material are being ionized, the characteristics of the deposited film can be freely controlled by applying to the substrate a variable voltage for controlling the characteristics of a deposited film, so as to control the incident energy of the ionized target material to the substrate.

2 Claims, 8 Drawing Figures

SPUTTERING DEVICE

TECHNICAL FIELD OF THE INVENTION

The present invention relates to a sputtering device in which an electric field and a magnetic field crossing at right angle thereto are utilized to generate a spiral motion of electrons in plasma for enhancing ionization, and the generated plasma is enclosed in a predetermined space to form an enclosed high density plasma from which ions are efficiently bombarded to a target, so that the sputtered target material is efficiently deposited to a substrate.

According to the sputtering device of the present invention, electrons are supplied from a hot filament to the enclosed plasma, thereby to increase the plasma density and to enhance ionization of inert gas, as well as ionization of the sputtered target material during its passage through the high density plasma.

BACKGROUND OF THE INVENTION

As a sputtering device, there are conventionally known a diode-type sputtering device, a radio frequency-type sputtering device, a magnetron-type sputtering device, etc.

Generally speaking, according to a diode sputtering device, the pressure of gas in the chamber is $10^{-2}$ to 1 Torr., while according to a radio frequency sputtering device and a magnetron sputtering device, the pressure of gas in the chamber is in the order of $10^{-3}$ to $10^{-2}$ Torr. Therefore, the film characteristics are greatly affected by the plasma discharge mode. This presents a problem as to reproducibility.

In a conventional sputtering device, the sputtered target material scatters while repeatedly colliding with the gas molecules in the chamber on the way to the substrate, so that an incident energy of the sputtered target material to the substrate is small and the deposition rate of the sputtered target material to the substrate is slow.

Furthermore, in a conventional sputtering device, only a so-called cold-cathode discharge is utilized, thus requiring a high voltage for maintaining the plasma discharge. Therefore, the temperature of the substrate rises extremely high by bombardment of electrons at the time when a film is formed. Thus, the substrate is subject to restriction in material.

DISCLOSURE OF THE INVENTION

A sputtering device in accordance with the present invention comprises a target electrode having a target and a flat magnet disposed under the target and constituted by an annular magnetic pole having one polarity and a magnetic pole having the other polarity located inside the annular magnetic pole having one polarity, a substrate disposed oppositely to the target, a ring electrode for electric field for generating an electric field in the flat magnet at right angle thereto, a filament disposed near the target, and an anode electrode for guiding the electron beam emitted from the filament, over the target.

BRIEF DESCRIPTION OF THE DRAWINGS

The present invention will be further described, by way of example, with reference to the accompanying drawings, in which.

DETAILED DESCRIPTION OF THE PREFERRED EMBODIMENTS

With reference to FIGS. 1 to 5, the description hereinafter will discuss in detail a first embodiment of the present invention in which one set of a filament and an anode electrode are disposed.

Figure 1:
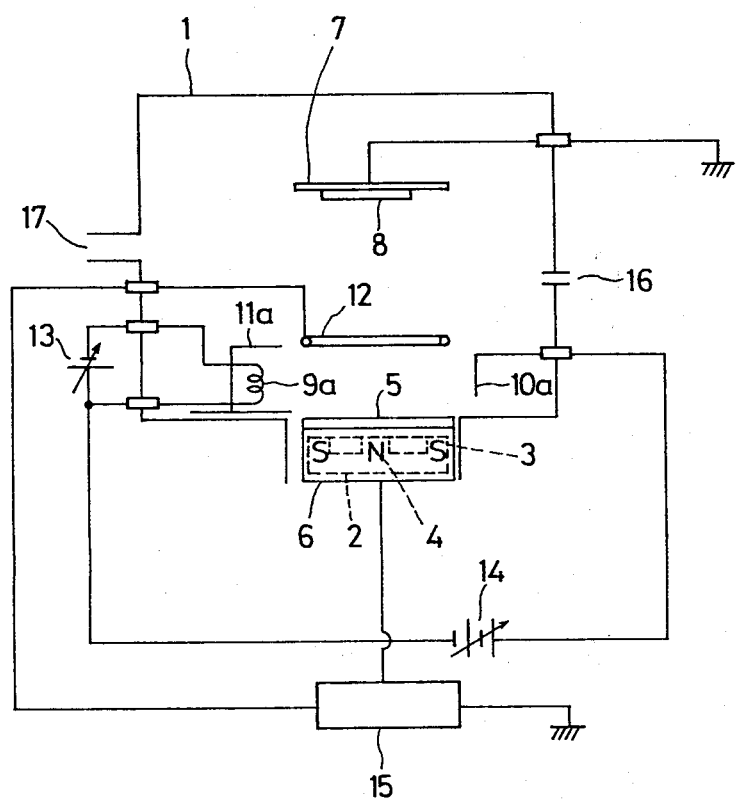
FIG. 1 is a structural diagram of main portions of a first embodiment of sputtering device in accordance with the present invention.

In FIG. 1, a flat magnet 2 located at the bottom of a vacuum chamber 1 comprises an annular magnetic pole having one polarity 3 and a magnetic pole having the other polarity 4 located inside the annular magnetic pole having one polarity 3.

A target 5 disposed on the magnet 2 constitutes a magnetron target electrode 6 together with the magnet 2. A substrate 8 is held at the lower surface of a substrate holder 7 disposed on the target 5.

A tungsten filament for emitting an electron beam 9a is disposed above and adjacent one side of the target 5. An anode electrode 10a for guiding the electron beam from the filament 9a over the target 5 is disposed oppositely to the filament 9a and is located above and adjacent the other side of the target 5.

A repeller 11a is disposed outside the filament 9a. A ring electrode for electric field 12 is disposed above the target 5 and in parallel with the top surface of the magnet 2, and generates an electric field on the magnet 2 at right angle thereto.

A filament heating power supply 13 has positive and negative electrodes respectively connected to the both ends of the filament 9a. An anode power supply 14 is connected to the filament heating power supply 13. The positive and negative electrodes of the anode power supply 14 are respectively connected to the anode electrode 10a and to the positive electrode of the filament heating power supply 13.

A power supply for electric field 15 is connected between the electrode for electric field 12 and the target electrode 6, and comprises a direct current power supply or a radio frequency power supply. Where a radio frequency power supply is used, one end of the power supply 15 is grounded.

A discharge gas inlet port 16 is formed in the vacuum chamber 1 and has a needle valve (not shown). An exhaust port 17 is formed in the vacuum chamber 1 and is connected to a vacuum pump (not shown).

The description hereinafter will discuss the operation of the first embodiment.

With the substrate 8 set to the substrate holder 7, gas in the vacuum chamber 1 is exhausted by the vacuum pump such that the pressure in the vacuum chamber 1 becomes in the order of $10^{-5}$ Torr. or less. On the other hand, the needle valve is adjusted to introduce argon gas from the discharge gas inlet port 16, thereby to set the pressure in the vacuum chamber to a predetermined gas pressure of $10^{-3}$ Torr. or less. With the power supply for electric field 15 operated, a negative voltage is applied to the target electrode 6. Then, plasma is formed near the target electrode 6. Argon gas in this plasma is ionized to produce argon ions. By such argon ions, a neutral target material constituting the target 5 is sputtered, and by the electrons in the plasma, the sputtered target material is ionized. The filament 9a is heated by the filament heating power supply 13, and a positive voltage is applied to the anode electrode 10a by the anode power supply 14, so that the electron beam from the filament 9a is guided over the target 5. By the magnet 2, such an electron beam is trapped in the magnetic field produced on the surface of the target 5. Since the electrons are excessively gathered on the surface of the target 5 and the electric field produced by the power supply for electric field 15 crosses at right angle to the magnetic field produced by the magnet 2, such electrons are spirally moved. Therefore, a collision probability of the electrons with the introduced argon gas is increased, so that ionization of the argon gas is enhanced and the sputtering rate is increased.

Since the target material sputtered by the argon ions collides with the electrons in the plasma and the electron beam from the filament, the ionized target material can be accelerated by the potential difference between the plasma and the substrate. Accordingly, the sputtered neutral target material and the ionized target material are deposited to the surface of the substrate 8 effectively, thereby to form a film thereon.

Figure 2:
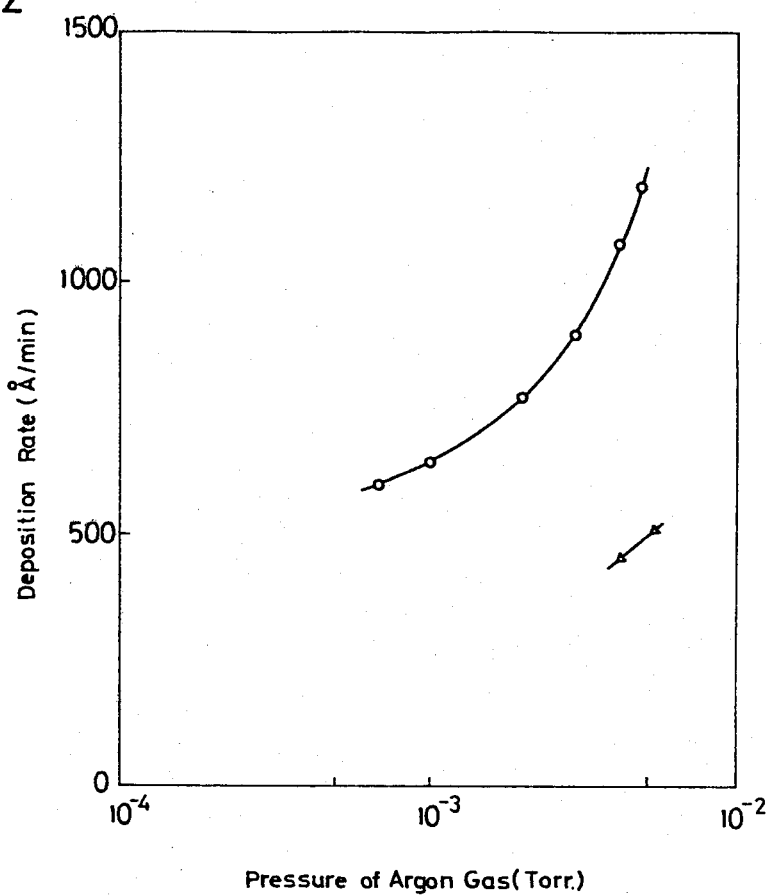
FIG. 2 shows the relationship between the pressure of argon gas and the deposition rate according to the sputtering device in FIG. 1 and a conventional magnetron-type sputtering device, respectively.
Figure 3:
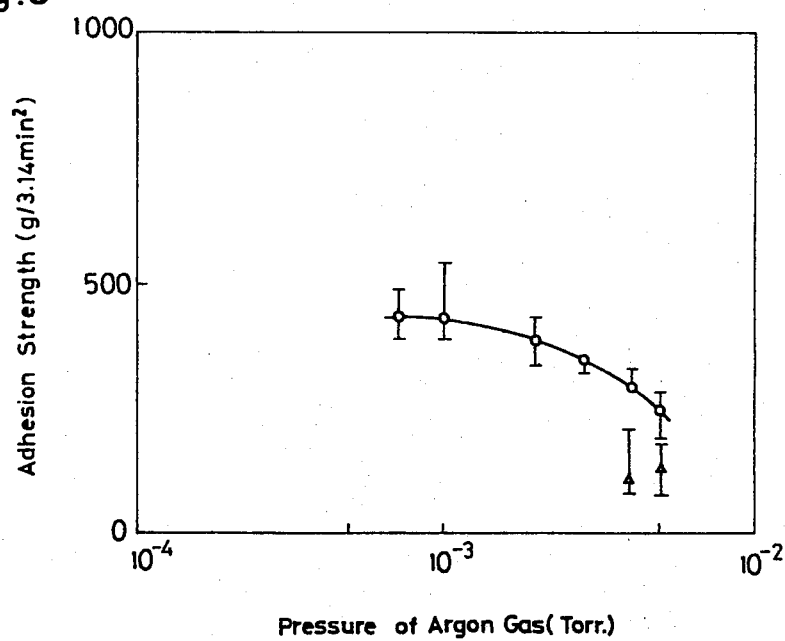
FIG. 3 shows the relationship between the pressure of argon gas and the adhesion strength according to the sputtering device in FIG. 1 and a conventional magnetron-type sputtering device, respectively.

While changing the pressure of the argon gas, the deposition rate and the adhesion strength were measured, under the conditions of the target material of copper, the substrate of glass, the discharge gas of argon gas, the DC sputtering voltage of 400 V, the filament voltage of 15 V, the filament current of 7A, the anode voltage of 400 V and the anode current of 300 mA. The results are shown in FIGS. 2 and 3, in which the values marked by "o" are those obtained in accordance with the present invention and the values marked by "Δ" are those obtained in accordance with a conventional magnetron-type sputtering device with the DC sputtering voltage set to 400 V. In FIGS. 2 and 3, it is to be noted that V is a volt, mA is a milliampere, Å is an angstrom, min is a minute, g is a gram, $mm^2$ is a square millimeter and Torr. is a vacuum unit.

As apparent from FIG. 2, while sputtering is realized only with the gas pressure of about $4 \times 10^{-3}$ Torr. in accordance with a conventional device, a film can be formed at a higher degree of vacuum in the order of $10^{-4}$ Torr. and at a higher speed in accordance with the present invention.

As apparent from FIG. 3, while the film adhesion strength in accordance with a conventional sputtering device was measured only in the range from 100 to 150 g/3.14 $mm^2$, the adhesion strength in accordance with the present invention becomes stronger as the degree of vacuum becomes higher; namely, it is improved about 4 times as compared with a conventional one.

Figure 4:
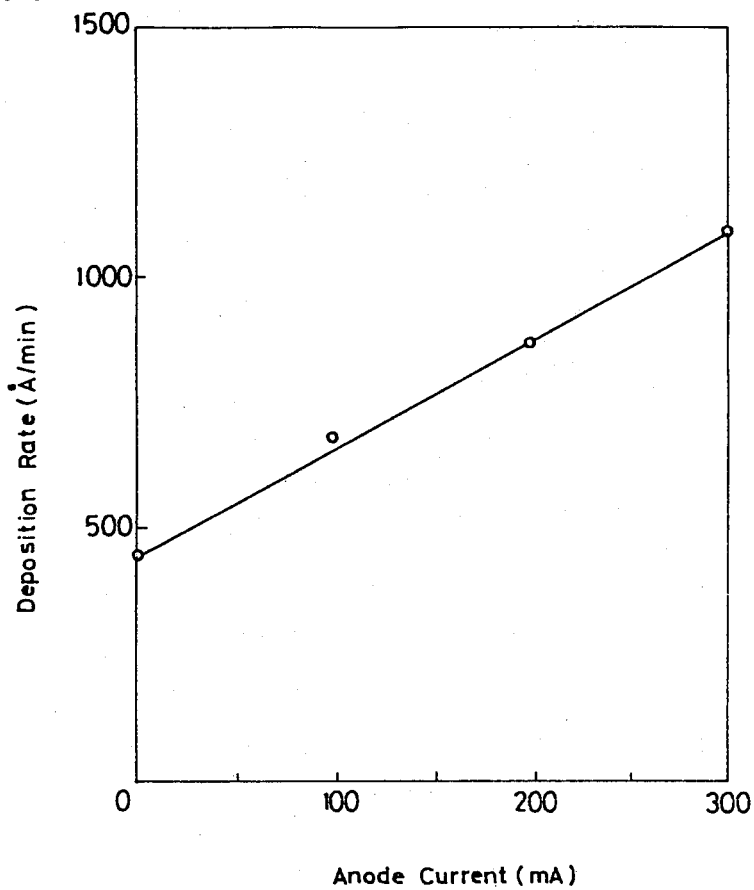
FIGS. 4 and 5 respectively show the relationships between the anode current and the deposition rate, and between the anode current and the adhesion strength, according to the sputtering device in FIG. 1.
Figure 5:
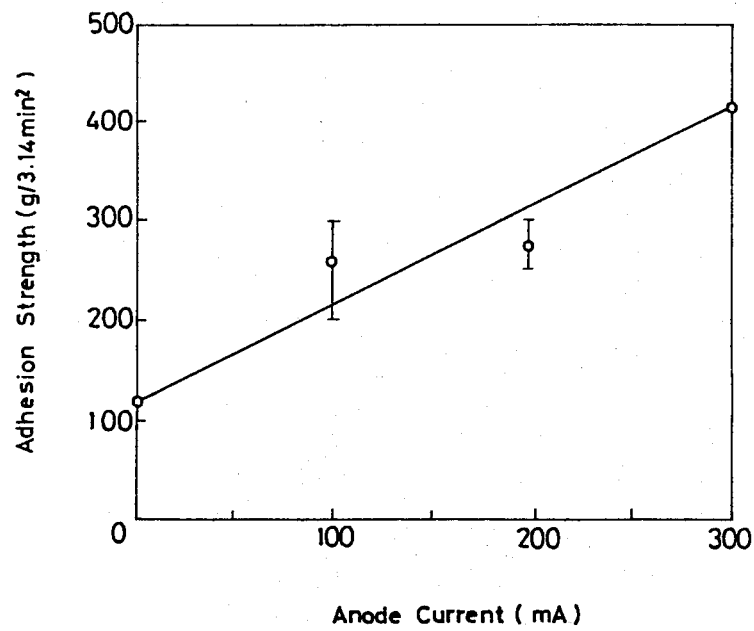

While changing the anode current, the deposition rate and the adhesion strength were measured under the conditions of the target material of copper, the substrate of glass, the discharge gas of argon gas, the vacuum degree of $4 \times 10^{-3}$ Torr., the DC sputtering voltage of 400 V and the anode voltage of 400 V. The results are shown in FIGS. 4 and 5. As apparent from FIGS. 4 and 5, the deposition rate and the adhesion strength are improved with the increase in anode current.

The color tone of the film produced with the high degree of vacuum is brighter than that of the film deposited by a conventional magnetron-type sputtering device. The reproducibility of the color tone is also better.

It is a matter of course that other materials than copper can be used as a target material.

Figure 6:
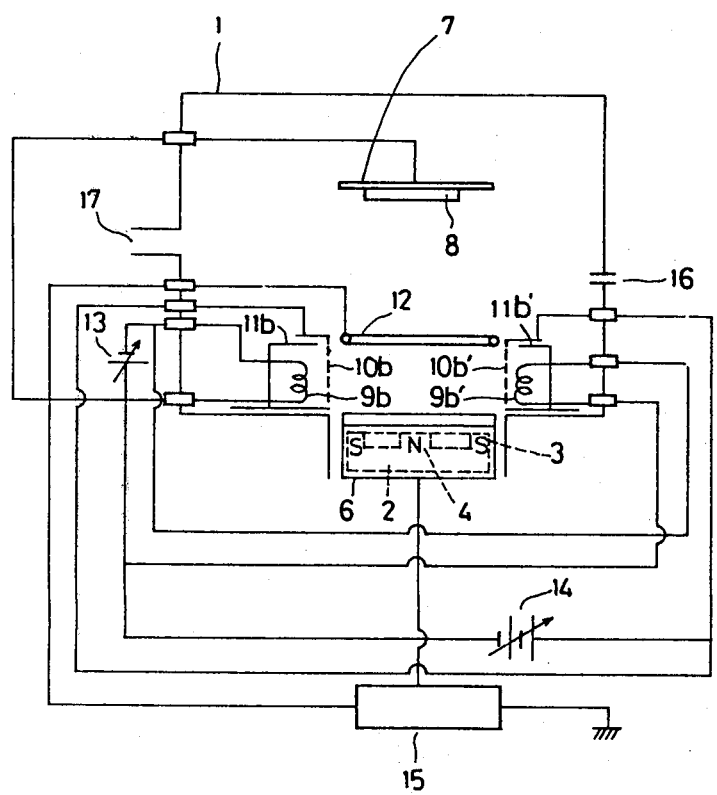
FIG. 6 is a structural diagram of main portions of a second embodiment of sputtering device on accordance with the present invention.
Figure 7:
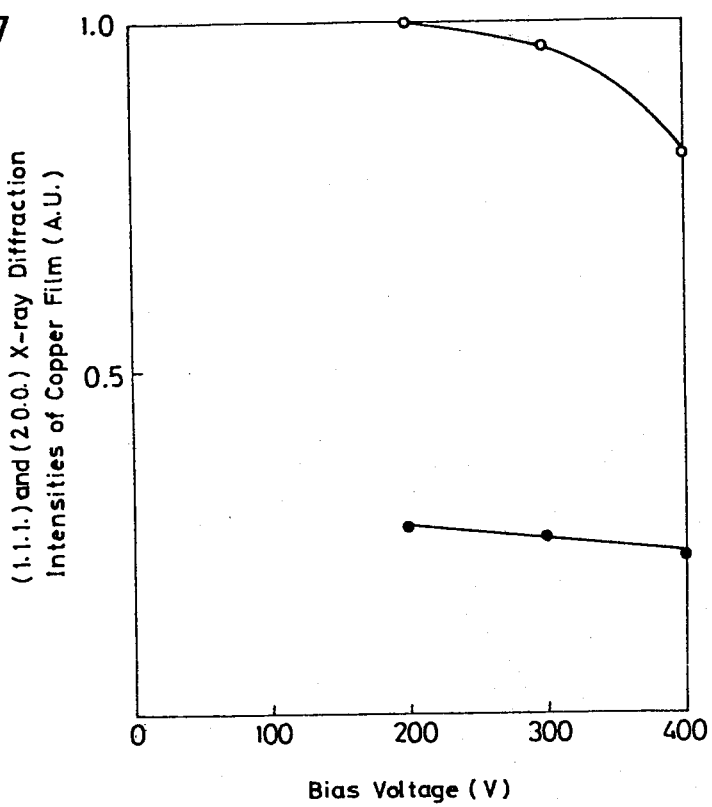
FIG. 7 shows the relationship between the bias voltage and the (1.1.1.) and (2.0.0.) X-ray diffraction intensities of copper film deposited on the substrate according to the sputtering device in FIG. 6.
Figure 8:
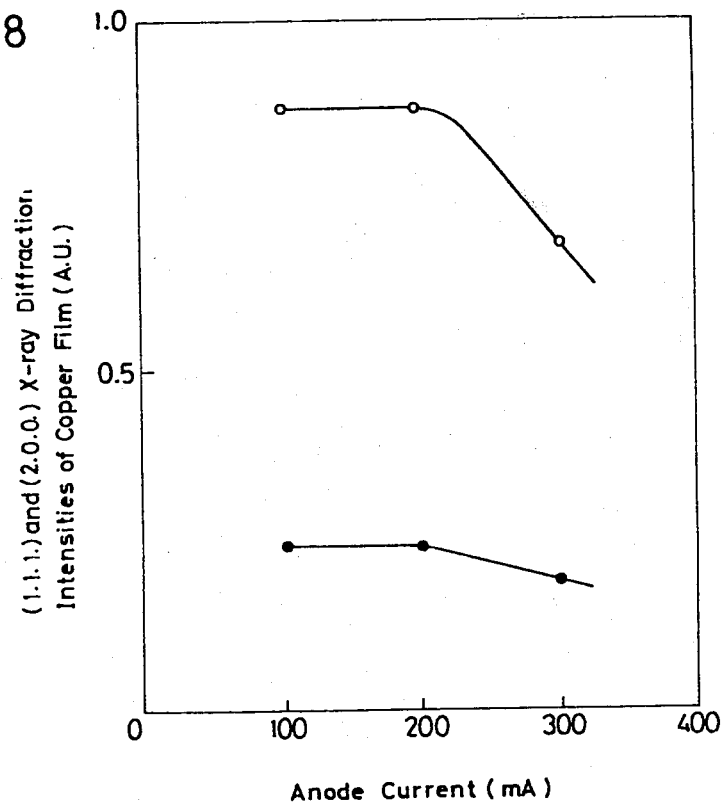
FIG. 8 shows the relationship between the anode current and the (1.1.1.) and (2.0.0.) X-ray diffraction intensities of copper film deposited on the substrate according to the sputtering device shown in FIG. 6.

With reference to FIGS. 6 to 8, the description hereinafter will discuss a second embodiment of the present invention in which two sets of electron beam emitting filaments and anode electrodes are disposed, and a bias voltage or a variable voltage for controlling the characteristics of a film is applied to the substrate holder.

In FIG. 6, like parts are designated by like numerals used in FIG. 1.

In FIG. 6, an electron beam emitting filament 9b and an anode electrode 10b opposite to the filament 9b are disposed above and adjacent one side of the target electrode 6, and an electron beam emitting filament 9b' and an anode electrode 10b' opposite to the filament 9b' are disposed above and adjacent the other side of the target electrode 6.

Repellers 11b and 11b' are respectively disposed outside the filaments 9b and 9b'. The both ends of each of the filaments 9b and 9b' are respectively connected to the positive and negative electrodes of the filament heating power supply 13. The both anode electrodes 10b and 10b' are connected to the positive electrode of the anode power supply 14, and the substrate holder 7 is connected to the negative electrode of the anode power supply 14.

Likely the first embodiment, argon gas is introduced into the vacuum chamber 1 and the power supply for electric field 15 is operated to produce argon ions, simultaneously with the formation of plasma. By the operation of the filament heating power supply 13, an electron beam from the filaments 9b and 9b' are guided over the target 5.

According to such arrangement, the density of plasma can be further uniformed, and plasma discharge can be maintained with a higher degree of vacuum.

Portions of the target material sputtered by the argon ions are ionized, and a bias voltage or a substrate voltage is applied to the substrate 8 through the substrate holder 7. With the change in such bias voltage, the kinetic energy of the ionized target material is changed, whereby the characteristics of the deposited flim can be controlled.

While changing a bias voltage or a substrate voltage applied to the substrate 8 with the anode current set to 300 mA, and while changing the anode current with the bias voltage set to 400 V, the (1.1.1.) and (2.0.0.) X-ray diffraction intensities of copper film were measured, under the conditions of the target material of copper, the substrate 8 of glass, the discharge gas of argon gas, the vaccum degree of $2\times10^{-3}$ Torr. and the DC sputtering voltage of 400 V.

The results are shown in FIGS. 7 and 8, in which the axis of ordinate is in arbitrary units or A.U., and the values marked by "o" are (1.1.1.) X-ray diffraction intensities of the copper film, while the values marked by "•" are (2.0.0.) X-ray diffraction intensities of copper film.

As apparent from FIGS. 7 and 8, by changing the bias voltage or the anode current, the preferential orientation of copper film on the substrate 8 can be controlled; namely, the characteristics of the deposited film can be controlled.

Industrial Utility

According to the sputtering device of the present invention, ionization of the discharge gas is enhanced by an electron beam, so that sputtering can be performed with the chamber gas pressure in the order of $10^{-3}$ Torr. or less, and contamination due to impure gases such as residual gas and desorbed gas can be lessened, and a stable discharge mode can be maintained.

Furthermore, according to the present invention, ionization of the discharge gas is enhanced by the electron beam emitted from the filament to permit the density of plasma to be heightened, whereby the sputtering rate can be increased.

Moreover, since the sputtered target material passes through the plasma of a high density on the way to the substrate, portions of the neutral target material are ionized, whereby the target material can be efficiently deposited to the substrate and therefore the formation of film can be effectively performed.

In addition, since portions of the sputtered target material are being ionized, the characteristics of the deposited film can be freely controlled, by applying to the substrate a variable voltage for controlling the characteristics of a deposited film, so as to control the incident energy of the ionized target material to the substrate.

What is claimed is:

1. A sputtering device comprising:
   a target electrode having a target and a flat magnet disposed under said target said magnet comprised of an annular magnetic pole having one polarity and a magnetic pole having the other polarity located inside said annular magnetic pole;
   a substrate disposed oppositely to said target;
   an electric field ring electrode disposed between said substrate and said target for generating an electric field between said target electrode and said electric field ring electrode, said electric field being incident on said magnet in a direction substantially perpendicular thereto;
   an electron beam emitting filament disposed adjacent said target; and
   an anode electrode for guiding an electron beam from said filament between said target and said electric field ring electrode.

2. The sputtering device as set forth in claim 1, wherein a variable voltage for controlling the characteristics of a deposited material to be formed on the substrate, is applied to said substrate.

* * * * *